US008594136B2

(12) United States Patent
Cucchi et al.

(10) Patent No.: US 8,594,136 B2
(45) Date of Patent: Nov. 26, 2013

(54) TRANSMISSION OF PARALLEL DATA FLOWS ON A PARALLEL BUS

(75) Inventors: Silvio Cucchi, Gaggiano (IT); Riccardo Gemelli, Settimo M.se (IT); Luigi Ronchetti, Como (IT)

(73) Assignee: Alcatel Lucent, Paris (FR)

( * ) Notice: Subject to any disclaimer, the term of this patent is extended or adjusted under 35 U.S.C. 154(b) by 236 days.

(21) Appl. No.: 13/142,947

(22) PCT Filed: Dec. 11, 2009

(86) PCT No.: PCT/EP2009/066975
§ 371 (c)(1),
(2), (4) Date: Jun. 30, 2011

(87) PCT Pub. No.: WO2010/079043
PCT Pub. Date: Jul. 15, 2010

(65) Prior Publication Data
US 2011/0268133 A1 Nov. 3, 2011

(30) Foreign Application Priority Data

Jan. 9, 2009 (EP) .................................... 09305019

(51) Int. Cl.
*H04J 3/06* (2006.01)
(52) U.S. Cl.
USPC ............................ 370/510; 370/465; 370/503
(58) Field of Classification Search
USPC ......................................... 370/465, 503, 510
See application file for complete search history.

(56) References Cited

U.S. PATENT DOCUMENTS

| 6,606,576 | B2 * | 8/2003 | Sessions ........................ 702/107 |
| 2003/0174798 | A1 * | 9/2003 | Pickering et al. .............. 375/376 |
| 2004/0022238 | A1 * | 2/2004 | Kimmitt ........................ 370/366 |
| 2004/0258167 | A1 | 12/2004 | Powell |
| 2009/0063889 | A1 * | 3/2009 | Dada et al. .................... 713/503 |

OTHER PUBLICATIONS

Dartnell, P. et al; Serdes Framer Interface Level 5 (SFI-5): Implementation Agreement for 40Gb/s Interface for Physical Layer Devices OIF-SF15-01.01); Optical Internetworking Forum OIF; Online; Jan. 29, 2002; pp. 1-62; XP009119852; Retrieved frominternet: URL:http://www.oiforum.com/public/documents/OIF-SF15-01.0.pdf; retrieved Jul. 22, 2009.

* cited by examiner

*Primary Examiner* — Jason Mattis
(74) *Attorney, Agent, or Firm* — Carmen Patti Law Group, LLC

(57) ABSTRACT

There is described a method for transmitting N parallel data flows on a parallel bus. The method comprises, at a first communication device: generating a further parallel data flow comprising alignment words periodically distributed with a period; at each period, rotating the N of parallel data flows and the further parallel data flow thus generating N+1 rotated parallel data flows, each comprising part of the alignment words periodically distributed with a frame period; transmitting the N+1 rotated parallel data flows on respective physical connections of the parallel bus. The method further comprises, at a second communication device: aligning the N+1 rotated parallel data flows by using the alignment words, thus compensating skew and obtaining N+1 aligned parallel data flows; and at each period, de-rotating the N+1 aligned parallel data flows, thus generating N de-rotated parallel data flows corresponding to the N parallel data flows.

13 Claims, 7 Drawing Sheets

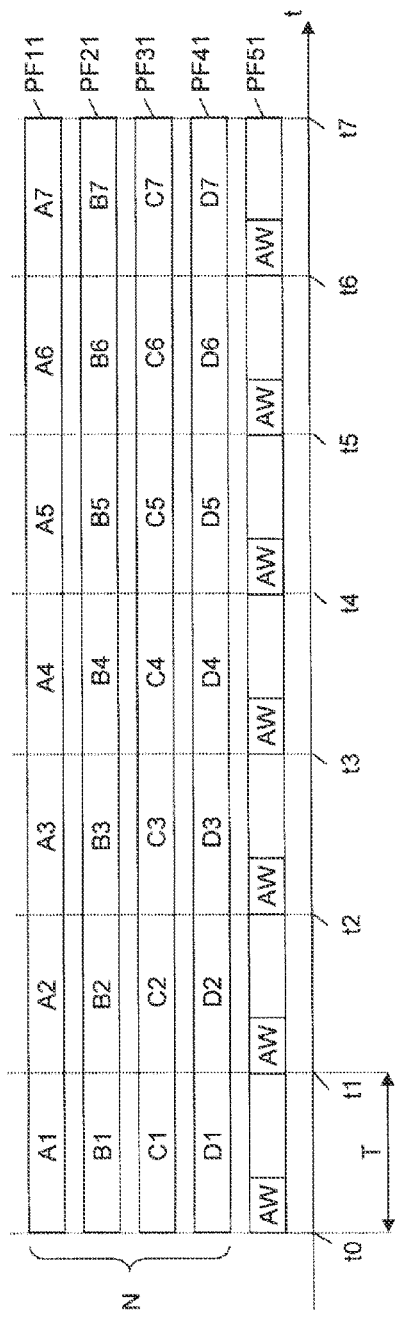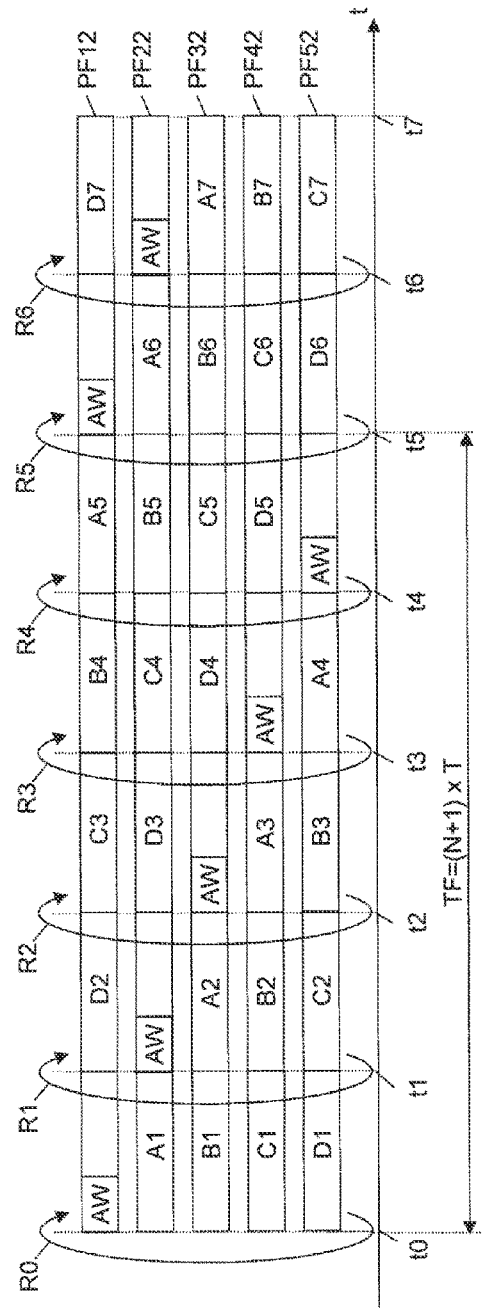

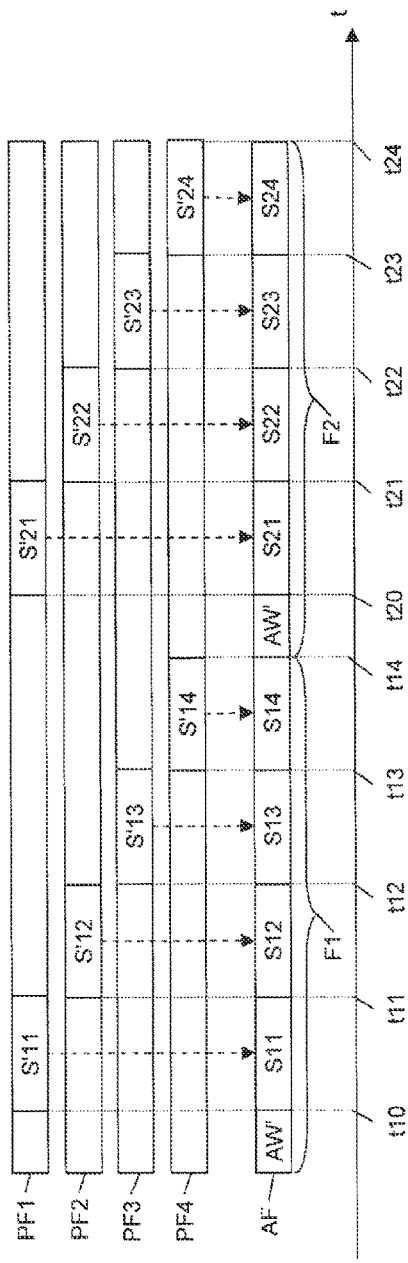
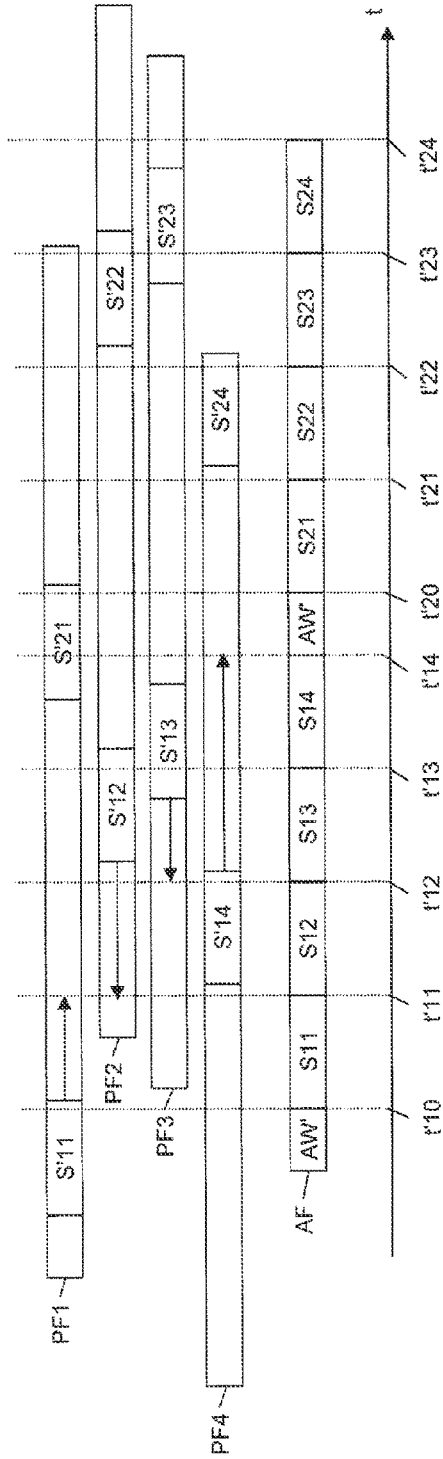
Figure 6a (prior art)
Figure 6b (prior art)

US 8,594,136 B2

TRANSMISSION OF PARALLEL DATA FLOWS ON A PARALLEL BUS

TECHNICAL FIELD

The present invention relates to the field of parallel communications. In particular, the present invention relates to a method for transmitting a number of parallel data flows on a parallel bus. Further, the present invention relates to a parallel communication system suitable for performing such a method.

BACKGROUND ART

As it is known, a parallel bus comprises a number of parallel physical connections suitable for connecting two communication devices and supporting exchange of data between them. Data transmission is shared among all the physical connections of the parallel bus. The physical connections may be either optical connections (e.g. optical fibers) or electrical connections. Parallel buses are opposed to serial buses, that transport data on a single physical connection.

Communication devices connected by means of a parallel bus have to be equipped with suitable interfaces known as "serdes" (serializer-deserializer). A serdes typically has a transmitting side and a receiver side. At the transmitting side, the serdes has a demultiplexer suitable for receiving an aggregated data flow from a serial bus and for performing a time-division demultiplexing on it for obtaining N parallel data flows, wherein N is lower than or equal to the number of physical connections within the parallel bus (deserialization). Each of the N parallel data flows is then transmitted on a respective physical link of the parallel bus. On the other hand, at the receiving side, the serdes has a multiplexer suitable for receiving N parallel data flows from respective physical connections of a parallel bus, and for performing a time-division multiplexing on them for recovering an aggregated data flow to be transmitted on a serial bus (serialization).

During propagation from the serdes of a first communication device to the serdes of a second communication device, each parallel data flow undergoes a different propagation delay. This may be due for instance to the fact that physical connections have slightly different lengths. Accordingly, bits of different parallel data flows that are transmitted at the same time from the serdes of a first communication device are received at the serdes of the second communication device at different times. This effect is termed "skew".

Skew is an undesirable effect, since it prevents the parallel data flows from being properly aligned at the receiving side, thereby causing errors in recovering the original sequence of bits of the aggregated data flow. The higher the parallel bus length and the higher the transmission data rate, the higher is the number of errors induced by skew on the recovered aggregated data flow.

The document "Serdes Framer Interface Level 5 (SFI-5): Implementation Agreement for 40 Gb/s Interface for Physical Layer Devices (OIF-SFI5-01.02)", Jan. 29, 2002, created by OIF (Optical Internetworking Forum), discloses a serdes for transmitting an aggregated optical data flow at 40 Gb/s by means of sixteen physical connections plus a "deskew" physical connection of a parallel bus, that is suitable to implement an alignment mechanism for compensating skew. The same document discloses also a quad serdes for transmitting four independent aggregated optical data flows at 10 Gb/s by means of four parallel buses, each constituted by four physical connections plus a deskew one, named SFI-5s. The operation of this serdes will be now explained by referring to FIGS. 6a and 6b.

At the transmitting side, an aggregated data flow to be transmitted over the parallel bus is divided into four parallel data flows PF1, PF2, PF3, PF4 by time division demultiplexing. Then, an additional flow AF is created, which is divided in frames F1, F2, ... of a predefined duration. By referring e.g. to the frame F1 shown in FIG. 6a, the serdes inserts in the frame F1 an alignment word AW'. Then, from time t10 to time t11, the serdes copies bits from the first parallel data flow PF1 into the frame F1, thus inserting into the frame F1 a copy S11 of a bit sequence S'11 of the first parallel data flow PF1. Then, from time t11 to time t12, the serdes copies bits from the second parallel data flow PF2 into the frame F1, thus inserting into the frame F1 a copy S12 of a bit sequence S'12 of the second parallel data flow PF2. Then, from time t12 to time t13, the serdes copies bits from the third parallel data flow PF3 into the frame F1, thus inserting into the frame F1 a copy S13 of a bit sequence S'13 of the third parallel data flow PF3. Then, from time t13 to time t14, the serdes copies bits from the fourth parallel data flow PF4 into the frame F1, thus inserting into the frame F1 a copy S14 of a bit sequence S'14 of the fourth parallel data flow PF4. The serdes then cyclically repeats the above procedure, thus forming the frame F2 of FIG. 6a and the successive frames, that for simplicity are not shown in FIG. 6a.

The parallel data flows PF1, PF2, PF3, PF4 and the additional flow AF are then transmitted each on a respective physical connection of the parallel bus.

At the receiving side, the parallel data flows PF1, PF2, PF3, PF4 and the additional flow AF are in general non-aligned, due to skew. This situation is shown in FIG. 6b. The additional flow AF is therefore read, by considering each sequence S11, S12, S13, S14 and by searching the corresponding sequence S'11, S'12, S'13, S'14 in the parallel data flow PF1, PF2, PF3, PF4, respectively. When the corresponding sequences S'11, S'12, S'13, S'14 are found, the parallel data flows PF1, PF2, PF3, PF4 are time-shifted as indicated by the arrows in FIG. 6b, for aligning the corresponding sequences S'11, S'12, S'13, S'14 to the sequences S11, S12, S13, S14 of the additional flow AF, respectively. This procedure is cyclically repeated for each parallel data flow upon alignment is found, each time a frame of the additional flow AF is received. Alignment procedure is completed when all parallel data flows are individually aligned. After successful alignment, the alignment is continuously checked.

SUMMARY OF THE INVENTION

The Applicant has noticed that the above solution for compensating skew has some drawbacks.

First of all, disadvantageously, data received during the above alignment operation are lost.

Furthermore, the above solution does not guarantee that the parallel data flows are successfully aligned at the receiving side each time a frame of the additional flow AF is received.

Indeed, alignment is based on finding corresponding sequences in the additional flow and in the parallel data flow. However, the content of these sequences is not predefined, but depends on the content of the parallel data flows. Accordingly, if one of the parallel data flows (e.g. the first parallel data flow PF1) comprises a pattern of the type "01010101 ... " and the sequence S11 is copied from such a pattern, at the reception side the serdes in not able to find a unique sequence S'11 corresponding to the sequence S11. Indeed, the first parallel data flow PF1 comprises a plurality of sequences that match with the sequence S11 and that are shifted of two bits the ones relative to the others. The serdes therefore does not known which is the corresponding sequence to be used for performing alignment and, accordingly, alignment of the first data flow PF1 is unsuccessful. This situation disadvantageously persists until the pattern of the type "01010101 . . . " ends. However, the length of such a pattern is unpredictable, since it depends on the content of the first parallel data flow PF1, and may affect the sequences S11, S21, etc. copied from the first parallel data flow PF1 in an unpredictable number of consecutive frames F1, F2, . . . . Therefore, the time for recovering alignment of the first parallel data flow PF1 disadvantageously is unpredictable.

Therefore, the Applicant has tackled the problem of providing a method for transmitting a number of parallel data flows on a parallel bus that allows to compensate skew and, at the same time, overcomes the aforesaid drawbacks.

In particular, the Applicant has tackled the problem of providing a method for transmitting a number of parallel data flows on a parallel bus, that allows to compensate skew of the parallel data flows without unpredictable delays and independently of the content of the parallel data flows.

According to a first aspect, the present invention provides a method for transmitting a number N of parallel data flows on a parallel bus from a first communication device to a second communication device, the method comprising, at the first communication device:

a) generating a further parallel data flow comprising a plurality of alignment words periodically distributed with a period;
b) at each period, rotating the number N of parallel data flows and the further parallel data flow thus generating a further number N+1 of rotated parallel data flows, each of the further number N+1 of rotated parallel data flows comprising part of the plurality of alignment words periodically distributed with a frame period;
c) transmitting the further number N+1 of rotated parallel data flows on respective physical connections of the parallel bus, the method further comprising, at the second communication device:

d) aligning each of the further number N+1 of rotated parallel data flows by using the part of the plurality of alignment words, thus compensating skew and obtaining a further number N+1 of aligned parallel data flows; and
e) at each period, de-rotating the further number N+1 of aligned parallel data flows, thus generating a number N of de-rotated parallel data flows corresponding to the number N of parallel data flows.

Preferably, step b) comprises rotating the number N of parallel data flows and the further parallel data flow at every time instant tk at which one of plurality of alignment words of the further parallel data flow begin.

Preferably, step b) comprises, at every time instant tk, shifting transmission of each parallel data flow of the number N of parallel data flows and the further parallel data flow from an m-th physical connection of the parallel bus to an m'-th physical connection of the parallel bus, wherein:
the m-th physical connection is a physical connection that would transport the each parallel data flow if no rotation were performed, and
m' is given by the following equation:

$m'=[1+((m-1)+(k+\Phi)\mod(N+1))\mod(N+1)]$, $\Phi$ being a fixed phase shift ranging from 0 to the number N.

Preferably, step d) comprises:
selecting a rotated parallel data flow among the further number N+1 of rotated parallel data flows;
generating an internal reference time base comprising internal reference time instants delimiting segments transported by the selected rotated parallel data flow;
for each of the further number N+1 of rotated parallel data flows, generating an alignment information indicative of a time shift relative to the internal reference time base; and
aligning each rotated parallel data flow to the selected rotated parallel data flow according to the alignment information.

Preferably, step d) further comprises:
according to the alignment information, selecting a most delayed rotated parallel data flow among the rotated parallel data flows; and
generating an external reference time base comprising external reference time instants delimiting segments transported by the most delayed rotated parallel data flow.

Preferably, step e) comprises de-rotating the further number N+1 of aligned parallel data flows at each of the external reference time instants.

Profitably, step e) comprises, at each of the external reference time instants, shifting transmission of each aligned parallel data flow of the further number N+1 of aligned parallel data flows from an m'-th physical connection of the parallel bus to an m"-th physical connection of the parallel bus (PB), wherein:
the m'-th physical connection is a physical connection from which the each aligned parallel data flow is received, and m" is given by the following equation:

$m''=[1+((m'-1)+(N+1)-(k+\Phi')\mod(N+1))\mod(N+1)]$, $\Phi'$ being a further fixed phase shift ranging from 0 to the number N.

Preferably, the method further comprises, between steps b) and c), a step of scrambling contents of the further number N+1 of rotated parallel data flows except the alignment words.

Preferably, the method further comprises, between steps d) and e), a step of de-scrambling contents of the aligned data flows except the alignment words.

Profitably, the alignment words have a duration lower than the period T, so that the further parallel data flow comprises free bits between consecutive alignment words.

Preferably, step a) further comprises a step of using the free bits for one or more of the following purposes: correction of errors, insertion of identifiers of the parallel flows, insertion of symbols for DC coupling, generation of transitions for facilitating clock recovery, increase of available bandwidth of the parallel bus.

Profitably, step a) comprises inserting in the free bits, after each of the plurality of alignment words, a frame identifier suitable for identifying, after the step b) is performed, each of the further number N+1 of rotated parallel data flows.

According to a second aspect, the present invention provides a communication system comprising a first communication device, a parallel bus and a second communication device, the first communication device being configured to transmit a number N of parallel data flows to the second communication device on the parallel bus, wherein the first communication device comprises:
an alignment word generator configured to generate a further parallel data flow comprising a plurality of alignment words periodically distributed with a period;

a rotator configured to, at each period, rotate the number N of parallel data flows and the further parallel data flow thus generating a further number N+1 of rotated parallel data flows, each of the further number N+1 of rotated parallel data flows comprising part of the plurality of alignment words periodically distributed with a frame period;

and wherein the second communication device comprises:

a further number N+1 of aligners configured to align each of the further number N+1 of rotated parallel data flows by using the part of the plurality of alignment words, thus compensating skew and obtaining the further number N+1 of aligned parallel data flows; and a de-rotator configured to, at each period, de-rotate the further number N+1 of aligned parallel data flows, thus generating the number N of de-rotated parallel data flows corresponding to the number N of parallel data flow.

BRIEF DESCRIPTION OF THE DRAWINGS

The present invention will be better understood by reading the following detailed description, given by way of example and not of limitation, to be read by referring to the accompanying drawings, wherein:

FIGS. 2a and 2b show the structure of five parallel data flows, before and after processing by the rotator, respectively;

FIGS. 6a and 6b (already described above) show the structure of four parallel data flows processed for compensating skew according to the prior art solution, at the transmission and at the reception side respectively.

DETAILED DESCRIPTION OF PREFERRED EMBODIMENTS OF THE INVENTION

Figure 1:
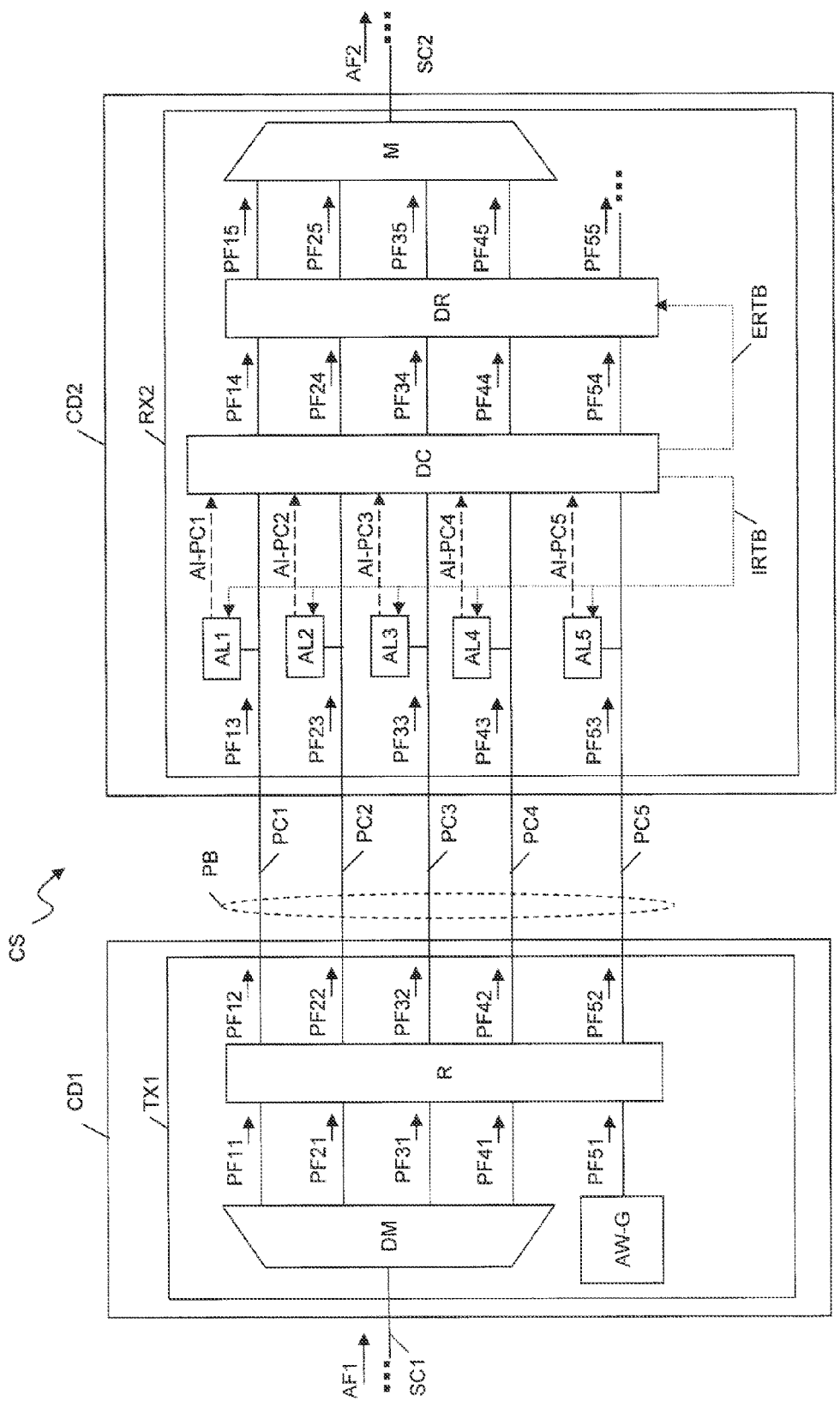
FIG. 1 schematically shows a communication system comprising a first communication device and a second communication device.

FIG. 1 schematically shows a communication system CS comprising a first communication device CD1, a second communication device CD2 and a parallel bus PB connecting the first communication device CD1 and the second communication device CD2.

The parallel bus PB comprises N+1 physical connections, N being an integer number. The parallel bus PB may be either an electrical parallel bus or an optical parallel bus. The first communication device CD1 and the second communication device CD2 may be for instance two network apparatuses of a communication network (such as e.g. two routers, two switches, etc.), or two boards of a same network apparatus. However, they may also be two computers connected to a local network, or two physical devices such as ASIC, FPGA, etc.

The first communication device CD1 comprises a transmitter TX1, in turn preferably comprising: a demultiplexer DM, an alignment word generator AW-G and a rotator R. Preferably, the demultiplexer DM has an input connected to a first serial connection SC1 and N outputs connected to the rotator R. The rotator R, in turn, has N inputs connected to respective outputs of the demultiplexer DM, a further input connected to the alignment word generator AW-G and N+1 outputs, each of the N+1 outputs being connected to a respective physical connection of the parallel bus PB.

According to embodiments not shown in the drawings, the first serial connection SC1 may be replaced with a connection of another type, such as for instance an input parallel bus supporting transmission of parallel data flows formatted according to a proprietary format. In this case, preferably, the demultiplexer M may be omitted, and the physical connections of the input parallel bus may be connected directly to the rotator R.

The second communication device CD2 preferably comprises a receiver RX2, in turn comprising: N+1 aligners, a delay compensator DC, a de-rotator DR and a multiplexer M. Preferably, each aligner has an input connected to a respective physical connection of the parallel bus PB. Further, each aligner has an output connected to the delay compensator DC. The delay compensator DC has N+1 inputs, each connected to a respective physical connection of the parallel bus PB, N+1 additional inputs, each connected to a respective aligner, and N+1 outputs connected to the de-rotator DR. Preferably, the de-rotator DR has N+1 inputs connected to respective outputs of the delay compensator DC, and N outputs connected to the multiplexer M and an additional output, whose role will be explained herein after. The multiplexer M in turn has N inputs connected to respective outputs of the de-rotator DR and one output connected to a second serial connection SC2.

According to embodiments not shown in the drawings, the second serial connection SC2 may be replaced with a connection of another type, such as for instance an output parallel bus supporting transmission of parallel data flows formatted according to a proprietary format. In this case, preferably, the multiplexer DM may be omitted, and the de-rotator DR may be connected directly to the physical connections of the output parallel bus.

By way of example, in FIG. 1 it is assumed that N is equal to 4. Accordingly, the parallel bus PB shown in FIG. 1 comprises five physical connections PC1, PC2, ..., PC5. Besides, at the transmitter TX1, the demultiplexer DM has four outputs, while the rotator R has five inputs and five outputs. Besides, the receiver RX2 comprise five aligners AL1, AL2, ... AL5, the delay compensator DC has five inputs, five additional inputs and five outputs, the de-rotator DR has five inputs, four outputs and an additional output, while the multiplexer M has four inputs.

Both the first communication device CD1 and the second communication device CD2 may comprise other components, that are not shown in FIG. 1 since they are not relevant to the present description. In particular, the first communication device CD1 may comprise a receiver (not shown in the drawings) having substantially the same structure as the receiver RX2 of the second communication device CD2. Similarly, the second communication device CD2 may comprise a transmitter (not shown in the drawings) having substantially the same structure as the transmitter TX1 of the first communication device CD1. This advantageously allows providing bidirectional communication between the first communication device CD1 and the second communication device CD2.

Herein after, the operation of the communication system CS will be described in detail.

By way of example, it is considered a situation in which an aggregated data flow AF1 has to be transmitted from the first communication device CD1 to the second communication device CD2 through the parallel bus PB. This is merely exemplary since, in the above mentioned case in which the first communication device CD1 comprises also a receiver and the second communication device CD2 comprises also a transmitter, the aggregated data flow AF1 could be transmitted from the second communication device CD2 to the first communication device CD1.

The first communication device CD1 may receive the aggregated data flow AF1 e.g. from the first serial connection SC1, as shown in FIG. 1.

When the first communication device CD1 receives from the first serial connection SC1 the aggregated data flow AF1 to be transmitted, it preferably performs a time-division demultiplexing operation by means of the demultiplexer DM. The demultiplexer DM then outputs four parallel data flows PF11, PF21, PF31, PF41, that are shown in FIG. 2a.

Substantially at the same time, a fifth parallel data flow PF51 is provided, and the alignment word generator AW-G periodically inserts an alignment word AW in such a fifth parallel data flow PF51, with a period T. The time instants at which the alignment words AW begin are indicated on the time axis of FIGS. 2a and 2b as t0, t1, ..., t7. Preferably, the alignment word AW has a predefined content. Preferably, the duration of the alignment word AW is lower than the period T. This advantageously allows to provide free bits between consecutive alignment words AW, as shown in FIG. 2a. These free bits may be used for purposes other than alignment of the parallel data flows, such as for instance FEC ("Forward Error Correction"), as it will be described in detail herein after.

The time instants t0, t1, ..., t7 define a time base according to which the four parallel data flows PF11, PF21, PF31, PF41 are segmented. In particular, as shown in FIG. 2a, the parallel data flow PF1 has a segment A1 between t0 and t1, a segment A2 between t1 and t2, a segment A3 between t2 and t3, a segment A4 between t3 and t4, a segment A5 between t4 and t5, a segment A6 between t5 and t6, and a segment A7 between t6 and t7. The same applies also to the other parallel data flows PF21, PF31 and PF41, as shown in FIG. 2a.

The five parallel data flows PF11, PF21, ... PF51 are then forwarded to the rotator R.

According to preferred embodiments of the present invention, in every period T, the rotator R preferably performs a rotation of the five parallel data flows PF11, PF21, ..., PF51. In particular, preferably, the rotation is performed at every time instant tk, wherein k is an integer index counting the time instants t0, t1, ..., t7 at which the alignment words AW of the fifth parallel data flow PF51 begin.

Preferably, at the time instant tk, the rotation comprises shifting transmission of each parallel data flow PF11, PF21, ..., PF51 from an m-th physical connection of the parallel bus PB to an m'-th physical connection of the parallel bus PB. The m-th physical connection is the physical connection that would transport the parallel data flow if no rotation were performed, while m' is given by the following equation:

$$m' = [1 + ((m-1) + (k+\Phi) \bmod (N+1)) \bmod (N+1)], \quad [1]$$

wherein "(x)mod(y)" designates the remainder of (x) divided by (y). $\Phi$ is a fixed phase shift taking values in the closed interval [0, N]. In the following description, for simplicity, the fixed phase shift $\Phi$ is assumed to be equal to 1. Since in FIG. 1 it has been assumed that N=4, m' is given by the following equation:

$$m' = [1 + ((m-1) + (k+1) \bmod (5)) \bmod (5)]. \quad [1']$$

In the following description, a rotation of the five parallel data flows PF11, PF21, ..., PF51 performed according to the above equation 1' is termed "clockwise rotation".

If no rotation were performed, the parallel data flows PF11, PF21, PF31, PF41 and PF51 would be transmitted over the physical connections PC1, PC2, PC3, PC4 and PC5, respectively.

Therefore, at the time instant t0, the rotator R performs a rotation R0 (k=0) shifting each parallel data flow from the m-th physical connection to the m'-th physical connection, wherein m'=[1+((m−1)+(1)mod(5))mod(5)], i.e.:

m=1→m'=2, i.e. the parallel data flow that would be transmitted on the first physical connection PC1 is shifted to the second physical connection PC2;

m=2→m'=3, i.e. the parallel data flow that would be transmitted on the second physical connection PC2 is shifted to the third physical connection PC3;

m=3→m'=4, i.e. the parallel data flow that would be transmitted on the third physical connection PC3 is shifted to the fourth physical connection PC4;

m=4→m'=5, i.e. the parallel data flow that would be transmitted on the fourth physical connection PC4 is shifted to the fifth physical connection PC5; and m=5→m'=1, i.e. the parallel data flow that would be transmitted on the fifth physical connection PC5 is shifted to the first physical connection PC1.

Therefore, as shown in FIG. 2b, from t0 to t1 the segment A1 of the first parallel data flow PF11 is transmitted over the second physical connection PC2, the segment B1 of the second parallel data flow PF21 is transmitted over the third physical connection PC3, the segment C1 of the third parallel data flow PF31 is transmitted over the fourth physical connection PC4, the segment D1 of the fourth parallel data flow PF41 is transmitted over the fifth physical connection PC5, and the alignment word AW starting at t0 with the successive free bits of the fifth parallel data flow PF51 is transmitted over the first physical connection PC1.

The rotation is repeated at the other time instants t1, t2, ..., t7, i.e.:

at the time instant t1, the rotator R performs a rotation R1 (k=1) shifting each parallel data flow from the m-th physical connection to the m'-th physical connection, wherein m'=[1+((m−1)+(2)mod(5))mod(5)];

at the time instant t2, the rotator R performs a rotation R2 (k=2) shifting each parallel data flow from the m-th physical connection to the m'-th physical connection, wherein m'=[1+((m−1)+(3)mod(5))mod(5)];

at the time instant t3, the rotator R performs a rotation R3 (k=3) shifting each parallel data flow from the m-th physical connection to the m'-th physical connection, wherein m'=[1+((m−1)+(4)mod(5))mod(5)];

at the time instant t4, the rotator R performs a rotation R4 (k=4) shifting each parallel data flow from the m-th physical connection to the m'-th physical connection, wherein m'=[1+((m−1)+(5)mod(5))mod(5)]=m (i.e. the rotation R4 is a null rotation);

at the time instant t5, the rotator R performs a rotation R5 (k=5) shifting each parallel data flow from the m-th physical connection to the m'-th physical connection, wherein m'=[1+((m−1)+(6)mod(5))mod(5)], i.e. m'= [1+((m−1)+(1)mod(5))mod(5)] (i.e. the rotation R5 is the same as the rotation R0); and at the time instant t6, the rotator R performs a rotation R6 (k=6) shifting each parallel data flow from the m-th physical connection to the m'-th physical connection, wherein m'=[1+((m−1)+(7)mod(5))mod(5)], i.e. m'= [1+((m−1)+(2)mod(5))mod(5)] (i.e. the rotation R6 is the same as the rotation R1).

The rotator R preferably repeats the above rotation at each successive time instant not shown in FIG. 2a, at which an alignment word AW starts in the fifth parallel data flow PF51. In this way, the rotator R outputs, on each physical connection PC1, PC2, ..., PC5 of the parallel bus PB, a respective rotated parallel data flow PF12, PF22, ..., PF52. Each of these rotated parallel data flows PF12, PF22, ..., PF52 is structured in frames having a frame period TF equal to (N+1)×T. Since in the Figures it has been assumed N=4, the frame period is 5 T. For instance, FIG. 2b shows a frame of the first rotated parallel data flow PF12, starting at the time instant t0 and ending at the time instant t5. Besides, FIG. 2b also shows a frame of the second rotated parallel data flow PF22, starting at the time instant t1 and ending at the time instant t6. Besides, FIG. 2b also shows a frame of the third rotated parallel data flow PF32, starting at the time instant t2 and ending at the time instant t7. Each frame comprises an alignment word AW with the successive free bits and a segment of each of the parallel data flows PF11, PF21, PF31 and PF41, in the reverse order. For instance, the frame of the first rotated parallel data flow PF12 shown in FIG. 2b, after the free bits, comprises a segment D2 of the fourth parallel data flow PF41, a segment C3 of the third parallel data flow PF31, a segment B4 of the second parallel data flow PF21 and a segment A5 of the first parallel data flow PF11.

The above disclosed rotation is merely exemplary. Other rotations could be used, provided that such rotation results in each rotated parallel data flow PF12, PF22, ..., PF52 periodically comprising an alignment word AW.

For instance, rotation of the parallel data flows PF11, PF21, ... PF51 may be performed in a rotation direction opposite to that described above. In the following description, a rotation of the parallel data flows PF11, PF21, ... PF51 performed in a rotation direction opposite to that described above is termed "clockwise rotation". In this case, at the time instant tk, rotation comprises shifting transmission of each parallel data flow from an m-th physical connection of the parallel bus PB to an m'-th physical connection of the parallel bus PB, wherein the m-th physical connection is the physical connection that would transport the parallel data flow if no rotation were performed, and m' is given by the following equation:

$$m'=[1+((m-1)+(N+1)-(k+\Phi)\bmod(N+1))\bmod(N+1)], \quad [2]$$

wherein, as mentioned above with reference to equation 1, "(x)mod(y)" designates the remainder of (x) divided by (y), while $\Phi$ is a fixed phase shift taking values in a closed interval [0, N].

The rotated parallel data flows PF12, PF22, ..., PF52 are then transmitted over the parallel bus PB to the second communication device CD2, by means of N+1 suitable transmitting modules (not shown in FIG. 1), such as for instance electrical or optical transmitters. According to a particularly advantageous variant of the present invention, the content of each rotated parallel data flow PF12, PF22, ..., PF52 (except the alignment words AW) is scrambled before transmission on the parallel bus PB. This advantageously allows to remove from each rotated parallel data flow PF12, PF22, ..., PF52 possible patterns reproducing the content of the alignment word AW. This advantageously prevents the receiver RX2 from aligning the received rotated parallel data flows PF12, PF22, ..., PF52 in a wrong way. Moreover, thanks to scrambling, the number of signal transitions in each of the rotated parallel data flow PF12, PF22, ..., PF52 is increased, and clock recovery is facilitated. Preferably, each rotated parallel data flow PF12, PF22, ..., PF52 is scrambled independently of the others. Moreover, preferably, the scrambling seed is reloaded at each frame period TF. This advantageously allows avoiding propagation of errors.

Figure 3A:
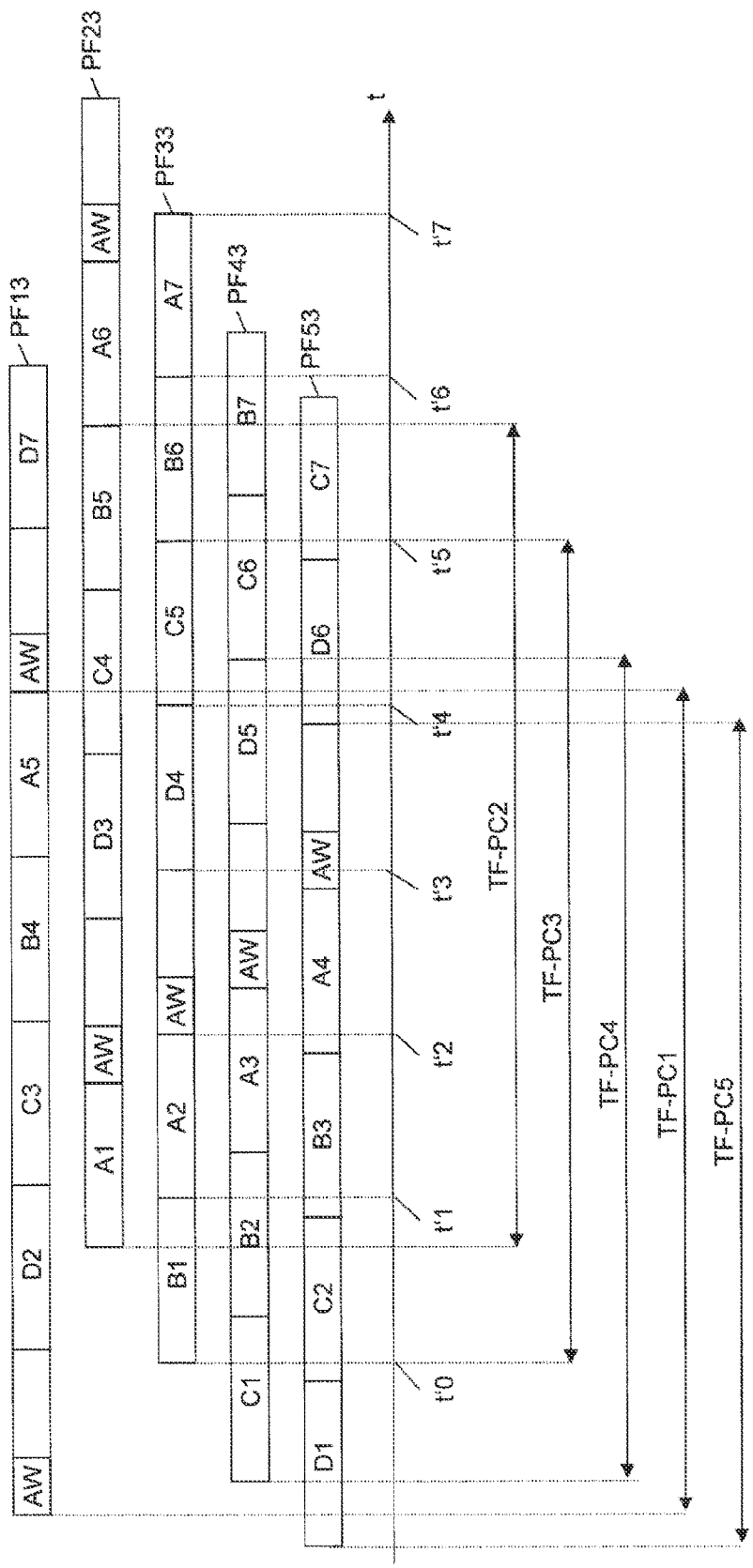
FIGS. 3a and 3b show the structure of five parallel data flows, during processing by the aligners.

When the rotated parallel data flows PF12, PF22, ..., PF52, that after propagation on the parallel bus PB are indicated in FIG. 1 as PF13, PF23, ..., PF53 are received at the second communication device CD2 by means of suitable N+1 receiving modules (not shown in FIG. 1), they may be affected by skew, e.g. due to the fact that the five physical connections PC1, PC2, ..., PC5 of the parallel bus PB have different lengths. This situation is shown in FIG. 3a. In particular, FIG. 3a shows that the frame periods TF-PC1, TF-PC2, ..., TF-PC5 of the rotated parallel data flows PF13, PF23, ..., PF53 are time-shifted the one relative to the others.

When the rotated parallel data flows PF13, PF23, ..., PF53 are received at the second communication device CD2, they are firstly processed by the aligners AL1, AL2, ... AL5 of the receiver RX2.

In particular, preferably, means for clock recovery associated to the aligners (not shown in FIG. 1 for simplicity) recover timing information for each rotated parallel data flow PF13, PF23, ..., PF53.

Further, each aligner AL1, AL2, ..., AL5 preferably receives from the delay compensator DC an internal reference time base IRTB (shown with dotted lines in FIG. 1), i.e. a sequence of internal reference time instants t'0, t'1, ... t'7 that are indicated on the time axis of FIG. 3a. Preferably, the internal reference time instants t'0, t'1, ... t'7 are time instants delimiting the segments transported by one of the rotated parallel data flows PF13, PF23, ..., PF53. By way of example, in FIG. 3a it has been assumed that the internal reference time instants t'0, t'1, ... t'7 are the time instants delimiting the segments transported by the third rotated parallel data flow PF33. Lack of alignment between the rotated parallel data flows PF13, PF23, ..., PF53 therefore results in different time shifts of the rotated parallel data flows PF13, PF23, PF43 and PF53 relative to the internal reference time base IRTB, i.e. relative to the third rotated parallel data flow PF23.

Preferably, upon reception of a frame of the respective rotated parallel data flow PF13, PF23, ..., PF53, each aligner AL1, AL2, ..., AL5 measures the time shift between the frame period TF-PC1, TF-PC2, ..., TF-PC5 and the internal reference time base IRTB, and generates alignment information AI-PC1, AI-PC2, ..., AI-PC5 carrying the information indicative of such a time shift. Preferably, the aligners AL1, AL2, ..., AL5 are "look-aside" blocks, i.e. they do not alter the parallel data flows PF13, PF23, ..., PF53.

Preferably, in case at the transmission side a scrambling operation has been executed, a de-scrambling operation is performed on the rotated parallel data flows PF13, PF23, PF43 and PF53 after processing by the aligners. In particular, if the scrambling operation has been performed independently on each physical connection, the de-scrambling operation is preferably executed before processing by the delay compensator DC. Otherwise, it is preferably executed after processing by the delay compensator DC.

Figure 3B:
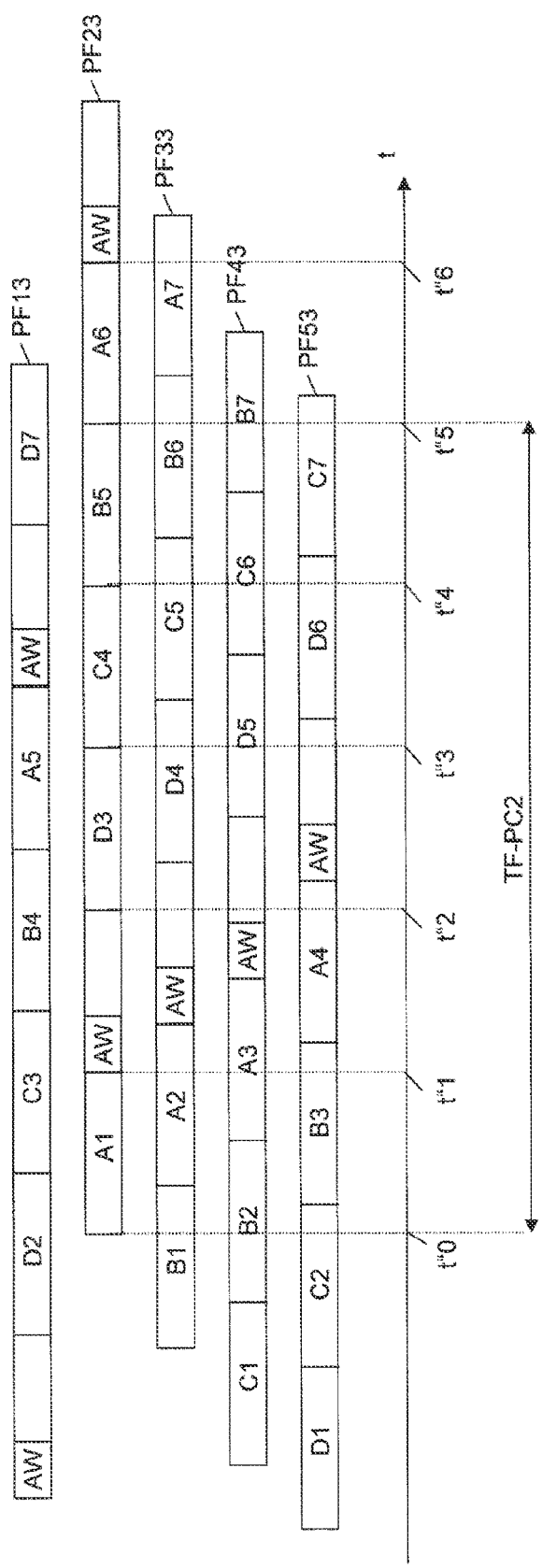

Preferably, the delay compensator DC receives the rotated parallel data flows PF13, PF23, ..., PF53, generates the above mentioned internal reference time base IRTB and transmits it to the aligners AL1, AL2, ..., AL5. Then, preferably, the delay compensator DC reads the alignment information AI-PC1, AI-PC2, ..., AI-PC5 received from the aligners AL1, AL2, ..., AL5, indicative of the time shifts of the rotated parallel data flows PF13, PF23, ..., PF53 relative to the internal reference time base IRTB. Preferably, according to these alignment information AI-PC1, AI-PC2, ..., AI-PC5, the delay compensator DC generates an external reference time base ERTB, i.e. a sequence of external reference time instants t"0, t"1, ... t"7, that are indicated on the time axis of FIG. 3b. Preferably, the external reference time base ERTB is based on to the most delayed of the rotated parallel data flows PF13, PF23, ..., PF53. Accordingly, the external reference time instants t"0, t"1, ... t"7 are time instants delimiting the segments transported by the rotated parallel data flow having the highest delay relative to the internal reference time base IRTB. By way of example, in FIGS. 3a and 3b it has been assumed that the second rotated parallel data flow PF23 is the one with the highest delay relative to the internal reference time base IRTB. Accordingly, the external reference time instants t"0, t"1, ... t"7 are set as the time instants delimiting the segments transported by the second rotated parallel data flow PF23.

The delay compensator DC then uses the alignment information AI-PC1, AI-PC2, ..., AI-PC5 for aligning all the rotated parallel data flows PF13, PF23, ..., PF53 to the external reference time base ERTB, i.e. to the most delayed rotated parallel data flow (i.e. the second rotated parallel data flow PF23, in this example).

Figure 4A:
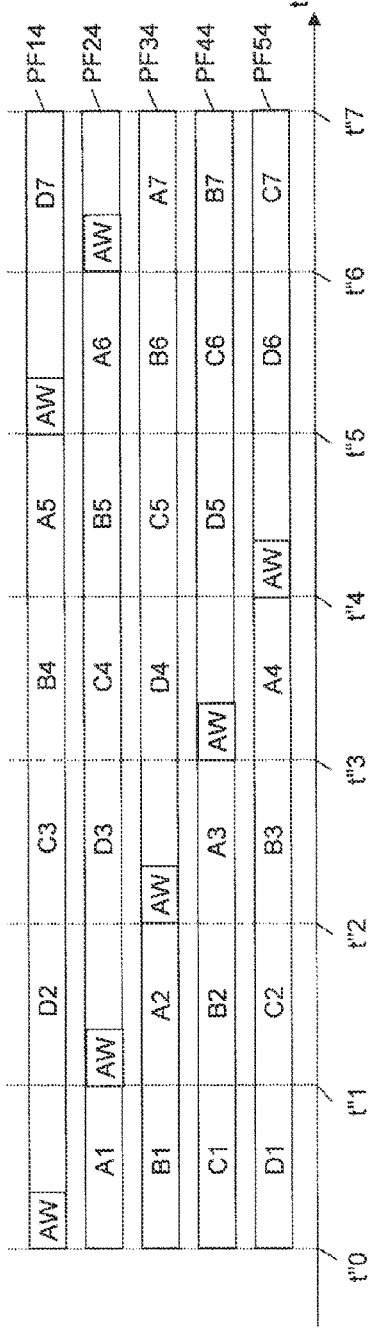
FIGS. 4a and 4b show the structure of five parallel data flows, before and after processing by the de-rotator, respectively.

This advantageously allows recovering alignment between the rotated parallel data flows PF13, PF23, ..., PF53 at the receiver RX2, thus compensating skew. The aligned parallel data flows PF14, PF24, ..., PF54 after processing by the delay compensator DC are shown in FIG. 4a.

The delay compensator DC then forwards the external reference time base ERTB to the de-rotator DR.

It can be noticed that the maximum relative skew that can be compensated by the delay compensator DC is equal to half the frame period, i.e. (N+1)T/2. In other words, the delay compensator DC can successfully re-align a rotated parallel data flow if the maximum relative time shift among parallel data flows is lower than (N+1)T/2. In the example of the Figures, therefore, the maximum skew MS that can be compensated is 2.5 T.

For instance, if the communication system CS is used for an application allowing a maximum skew of 250 bytes, by using N+1=5 physical connections of the parallel bus PB for transporting the aggregated signal and performing alignment at the receiving side, the period T shall be of at least 100 bytes, i.e. the alignment word generator AW-G should insert an alignment word AW on the fifth parallel data flow PF51 every 100 bytes. Indeed, in this way the frame period TF of the rotated parallel data flows is (N+1)×T=500 bytes, i.e. twice the maximum allowable skew.

On the other hand, if the communication system CS is used for an application allowing a maximum skew of 500 bytes, by using again N+1=5 physical connections of the parallel bus PB for transporting the aggregated signal and performing alignment at the receiving side, the period T shall be of at least 200 bytes. Indeed, in this way the frame period TF of the rotated parallel data flows is (N+1)×T=1000 bytes, i.e. twice the maximum allowable skew.

It has to be noticed that (N+1)T/2 is both the maximum skew compensation capability and the maximum skew detection capability. Indeed, in certain applications it may be necessary detecting the maximum possible skew, while compensating only a smaller amount of it. In such a case, the delay compensator DC includes a buffer whose size is preferably equal to the maximum amount of compensated skew and smaller to the maximum skew detection capability. In the example shown in the Figures, however, it is assumed that all the detectable skew is compensated.

The aligned parallel data flows PF14, PF24, ..., PF54 shown in FIG. 4a are then forwarded to the de-rotator DR.

According to preferred embodiments of the present invention, at each external reference time instant t"k (i.e. t"0, t"1, ..., t"7), the de-rotator DR preferably performs a further rotation of the five aligned parallel data flows PF14, PF24, ..., PF54 in a rotation direction opposite to the rotation performed by the rotator R.

Preferably, at the external reference time instant t"k, the further rotation comprises shifting transmission of each rotated parallel data flow from an m'-th physical connection of the parallel bus PB to an m"-th physical connection of the parallel bus PB. The m'-th physical connection is the physical connection from which the rotated parallel data flow is received, and m" is given by the following equation:

$$m''=[1+((m'-1)+(N+1)-(k+\Phi')\bmod(N+1))\bmod(N+1)], \quad [3]$$

wherein, as mentioned above, "(x)mod(y)" designates the remainder of (x) divided by (y), and $\Phi'$ is a further fixed phase shift taking values in the closed interval [0, N]. Preferably, the further fixed phase shift $\Phi'$ is set to the same value as the fixed phase shift $\Phi$ of equation 1 describing the rotation operation performed by the rotator R. Accordingly, in this example, the further fixed phase shift $\Phi'$ is equal to 1.

Therefore, while the rotator R performs a clockwise rotation, the de-rotator DR preferably performs a counterclockwise rotation.

Since in FIG. 1 it has been assumed that N=4, m" is given by the following equation:

$$m''=[1+((m'-1)+(5)-(k+1)\bmod(5))\bmod(5)]. \quad [3']$$

Then, at the external reference time instant t"0, the de-rotator DR preferably performs a further rotation DR0 (k=0) shifting each aligned parallel data flow from the m'-th physical connection to the m"-th physical connection, wherein m"=[1+((m'-1)+(5)−(1)mod(5))mod(5)], i.e.:

m'=1→m"=5, i.e. the aligned parallel data flow received from the first physical connection PC1 is shifted to the fifth physical connection PC5;

m'=2→m"=1, i.e. the aligned parallel data flow received from the second physical connection PC2 is shifted to the first physical connection PC1;

m'=3→m"=2, i.e. the aligned parallel data flow received from the third physical connection PC3 is shifted to the second physical connection PC2;

m'=4→m"=3, i.e. the aligned parallel data flow received from the fourth physical connection PC4 is shifted to the third physical connection PC3; and m'=5→m"=4, i.e. the aligned parallel data flow received from the fifth physical connection PC5 is shifted to the fourth physical connection PC4.

Figure 4B:
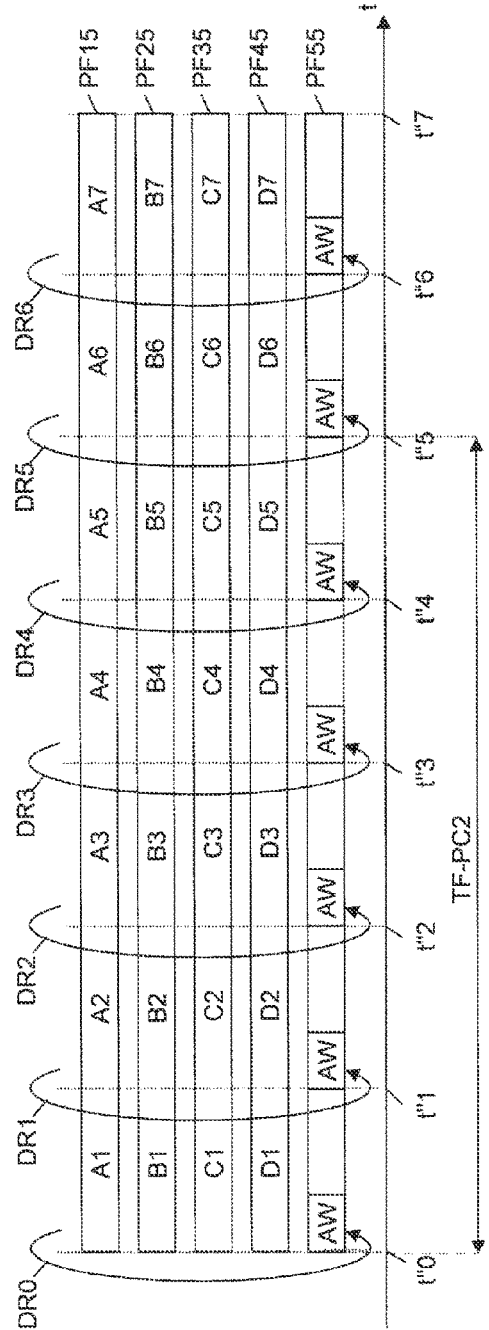

Therefore, as shown in FIG. 4b, between t"0 and t"1, the segment A1 of the second aligned parallel data flow PF24 is transmitted over the first physical connection PC1, the segment B1 of the third aligned parallel data flow PF34 is transmitted over the second physical connection PC2, the segment C1 of the fourth aligned parallel data flow PF44 is transmitted over the third physical connection PC3, the segment D1 of the fifth aligned parallel data flow PF54 is transmitted over the fourth physical connection PC4, and the frame with the alignment word AW and the free bits of the first rotated parallel data flow PF12 is transmitted over the fifth physical connection PC5.

The further rotation is repeated also at the other external reference time instants t"1, t"2, ... t"7, i.e.:

at the external reference time instant t'1, the de-rotator DR performs a further rotation DR1 (k=1) shifting each aligned parallel data flow from the m'-th physical connection to the m"-th physical connection, wherein m"=[1+((m'−1)+(5)−(2)mod(5))mod(5)];

at the external reference time instant t'2, the de-rotator DR performs a further rotation DR2 (k=2) shifting each aligned parallel data flow from the m'-th physical connection to the m"-th physical connection, wherein m"= [1+((m'−1)+(5)−(3)mod(5))mod(5)];

at the external reference time instant t'3, the de-rotator DR performs a further rotation DR3 (k=3) shifting each aligned parallel data flow from the m'-th physical connection to the m"-th physical connection, wherein m"= [1+((m'−1)+(5)−(4)mod(5))mod(5)];

at the external reference time instant t'4, the de-rotator DR performs a further rotation DR4 (k=4) shifting each aligned parallel data flow from the m'-th physical connection to the m"-th physical connection, wherein m"= [1+((m'−1)+(5)−(5)mod(5))mod(5)]=m' (i.e. the further rotation DR4 is a null rotation);

at the external reference time instant t'5, the de-rotator DR performs a further rotation DR5 (k=5) shifting each aligned parallel data flow from the m'-th physical connection to the m"-th physical connection, wherein m"= [1+((m'−1)+(5)−(6)mod(5))mod(5)], i.e. m"=[1+((m'−1)+(5)−(1)mod(5))mod(5)] (i.e. the further rotation DR5 is the same as the further rotation DR0); and at the external reference time instant t'6, the de-rotator DR performs a further rotation DR6 (k=6) shifting each rotated parallel data flow from the m'-th physical connection to the m"-th physical connection, wherein m"= [1+((m'−1)+(5)−(7)mod(5))mod(5)], i.e. m"=[1+((m'−1)+(5)−(2)mod(5))mod(5)] (i.e. the further rotation DR6 is the same as the further rotation DR1).

The de-rotator DR preferably repeats the above further rotation at each successive external reference time instant not shown in FIG. 4b, thus outputting, at each of its output, a respective de-rotated parallel data flow PF15, PF25, ..., PF55.

Preferably, if a counterclockwise rotation is performed at the rotator R, the de-rotator DR performs a clockwise rotation. In this case, at the time instants tk" of the external reference time base ERTB, de-rotator DR shifts transmission of each aligned parallel data flow from an m'-th physical connection of the parallel bus PB to an m"-th physical connection of the parallel bus PB, wherein the m'-th physical connection is the physical connection that would transport the parallel data flow if no de-rotation were performed, and m" is given by the following equation:

$$m''=[1+((m-1)+((k+\Phi')\bmod(N+1))\bmod(N+1)], \quad [4]$$

wherein, again, "(x)mod(y)" designates the remainder of (x) divided by (y) and Φ' is a further fixed phase rotation.

By referring again to FIG. 4b, it can be noticed that the de-rotated parallel data flows PF15, PF25, PF35 and PF45 output by the de-rotator DR correspond to the parallel data flows PF11, PF21, PF31 and PF41 output by the demultiplexer at the transmitter TX1. The fifth de-rotated parallel data flow PF55, on the other hand, corresponds to the fifth parallel data flow PF51 originated at the transmitter TX1.

In case the fifth parallel data flow PF51 is used only for alignment purposes, the fifth de-rotated parallel data flow PF55 is preferably discarded at the output of the de-rotator DR. Otherwise, if the free bits comprised in the fifth parallel data flow PF51 are used for other purposes (e.g. FEC, as mentioned above), the fifth de-rotated parallel data flow PF55 may be forwarded to further modules (not shown in FIG. 1) that process it.

The de-rotated parallel data flows PF15, PF25, PF35 and PF45 are then forwarded to the multiplexer M, that performs a time-division multiplexing operation thus recovering an aggregated data flow AF2 corresponding to the aggregated data flow AF1 received by the first communication device CD1. The second communication device CD2 may then transmit the aggregated data flow AF2 through the second serial connection SC2 connected to the multiplexer output.

The above disclosed method for compensating skew has a number of advantages.

First of all, advantageously, the above method allows mapping the aggregated flow on an arbitrary number of parallel data flows, since it is not based on aggregated signal framing alignment word and frame period.

Besides, advantageously, alignment of the parallel data flows at the receiver is advantageously based on an alignment word having a predefined content. Therefore, by suitably selecting the content of the alignment word, alignment of each parallel data flow is successfully performed at each frame, independently of the data contained in the aggregated data flow to be transmitted. This advantageously guarantees that the maximum delay in alignment is of the order of few frame periods TF, i.e. a few (N+1)×T. This time is deterministic, therefore unpredictable delays in performing alignment are avoided.

Moreover, advantageously, the method can be applied to any number of parallel data flows, since the parallel data flow PF51 generated by the alignment word generator AW-G and the period T are not dependent on the number of parallel data flows to be aligned. For instance, in case the number of parallel data flows is eight instead of four (i.e. N=8), both the parallel data flow PF51 (which is indeed the ninth parallel data flow) and the rotations are advantageously identical to what explained by referring to FIGS. 2a and 2b. The only difference is that the frame period TF, that is equal to (N+1)×T, is now 9 T, instead of 5 T. This, on one hand, increases the maximum delay in recovering alignment of the parallel data flows, that is equal to a few (N+1)×T i.e. a few 9 T. On the other hand, this increases the maximum skew MS that can be compensated, that is equal to (N+1)×T/2=4,5×T. Therefore, this method can be advantageously applied to communication systems where the capacity of the aggregated signal to be transmitted across the parallel bus changes and the number of physical connections used for transporting it changes accordingly, without requiring substantially any modification to the components involved in the alignment procedure.

Moreover, as mentioned above the fifth parallel data flow PF51 generated at the transmitter by the alignment word generator has a number of free bits that can be used for purposes other than alignment, such as FEC.

In this case, the transmitter TX1 may be provided with a FEC module (not shown in the drawings) at the input of the rotator R. When the FEC module receives the five parallel data flows PF11, PF21, ..., PF51, it preferably computes a FEC code. The FEC code may be computed in different ways. For example, the FEC code may be computed on consecutive segments of a same parallel data flow, or it may be computed on corresponding segments of the five parallel data flows. By referring again to FIG. 2a, for instance, a first FEC code may be calculated on the segments A1, B1, C1 and D1, and may be inserted in the free bits following the alignment word AW starting in t0. Similarly, a second FEC code may be calculated on the segments A2, B2, C2 and D2, and may be inserted in the free bits following the alignment word AW starting in t1. And so on. After the FEC module has calculated the FEC codes, the parallel data flows PF11, PF21, ..., PF51 are rotated by the rotator R (and possibly scrambled, as mentioned above), and then the resulting rotated parallel data flows PF12, PF22, ..., PF52 are transmitted over the parallel bus BP. At the receiver RX2, they are aligned by the aligners AL1, AL2, ... AL5 and by the delay compensator DC, and they are de-rotated by the de-rotator DR, thus obtaining the de-rotated parallel data flows PF15, PF25, ..., PF55.

At the output of the de-rotator DR, a further de-FEC module (not shown in the drawings) is preferably provided. Such a further de-FEC module preferably uses the de-FEC codes comprised in the fifth de-rotated parallel data flow PF55 for correcting possible errors of the segments comprised in the de-rotated parallel data flows PF15, PF25, PF35 and PF45. The corrected and de-rotated parallel data flows PF15, PF25, PF35 and PF45 are then forwarded to the multiplexer M, that recovers the aggregated data flow AF2.

Alternatively or in addition, the free bits of the fifth parallel data flow PF51 may be used for insertion of parallel flow identifiers. In particular, by referring again to FIGS. 2a and 2b, an identifier PF12-id may be inserted after the alignment word AW starting in t0, an identifier PF22-id may be inserted after the alignment word AW starting in t1, an identifier PF32-id may be inserted after the alignment word AW starting in t2, an identifier PF42-id may be inserted after the alignment word AW starting in t3 and an identifier PF52-id may be inserted after the alignment word AW starting in t4. Therefore, after rotations performed by the rotator R, each of the rotated parallel data flows PF12, PF22, ..., PF52 comprises its respective identifier PF12-id, PF22-id, ..., PF52-id, located after the alignment word AW of every frame. At the receiver RX2, a recognizer module (not shown in the drawings) may be provided e.g. just before the delay compensator DC block. Such a recognizer module intercepts all the alignment information AI-PC1, AI-PC2, ..., AIPC5 (that preferably comprise also the recovered identifier), checks their consistency respect to actual parallel data flows. The recognizer module may be implemented e.g. by two crossbar functions of size (N+1)×(N+1), one for the rotated parallel data flows PF13, PF23, ..., PF53, the other for ALINF signals.

This advantageously allows to check whether the rotated parallel data flows PF13, PF23, ..., PF53 are received at the receiver RX2 with the same order they had at the transmitter TX1, and to correctly feed the parallel data flows to the delay compensator DC for taking into account all possible inversions.

Indeed, in case an operator responsible of connecting the physical connections of the parallel bus PB from the first communication device CD1 to the second communication device CD2 connects the physical connections according to a wrong order (e.g. at the second communication device CD2, she/he inverts the second physical connection PC2 and the third physical connection PC3), according to the prior art solution shown in FIGS. 6a and 6b the second communication device CD2 can not become aware of this inversion. This disadvantageously may results in a wrong alignment of the second further parallel data flow PF22 and/or of the third further parallel data flow PF32. However, by using the free bits following each alignment word AW for inserting identifiers of the parallel data flows, the second communication device CD2 can detect all possible inversions, and restore the correct situation before the delay compensator DC.

Other possible uses of the free bits in the fifth parallel data flow PF52 may be for instance insertion of symbols for DC coupling, generation of transitions 1-0 for guaranteeing clock recovery, or increase of the parallel bus available bandwidth (i.e. transport of a part of the data to be transmitted). If, between two consecutive alignment words AW (referring to the parallel data flow PF51 of FIG. 2a), a sufficient number of free bits is provided, such free bits may be advantageously used for more than one of the above purposes.

As mentioned above, the maximum skew that can be compensated by the delay compensator DC is equal to half the frame period TF, i.e. (N+1)T/2. Advantageously, the free bits following the alignment words AW may be used for increasing the maximum skew that can be compensated, without increasing the period T. Indeed, the period T cannot be arbitrarily increased. Increasing the period T indeed requires changes in the aligners due to the fact that time elapsing between reception of two consecutive alignment words AW is increased. Another drawback implied by changing the period T is compatibility of FEC (when used) with the chosen T period. If, for instance, a first period T is chosen to be compatible with an available FEC and then, for increasing the skew compensation capability, a second frame period T'>T is chosen (e.g. T'=1.5×T), the FEC is no more compatible with the new frame period T'.

Figure 5A:
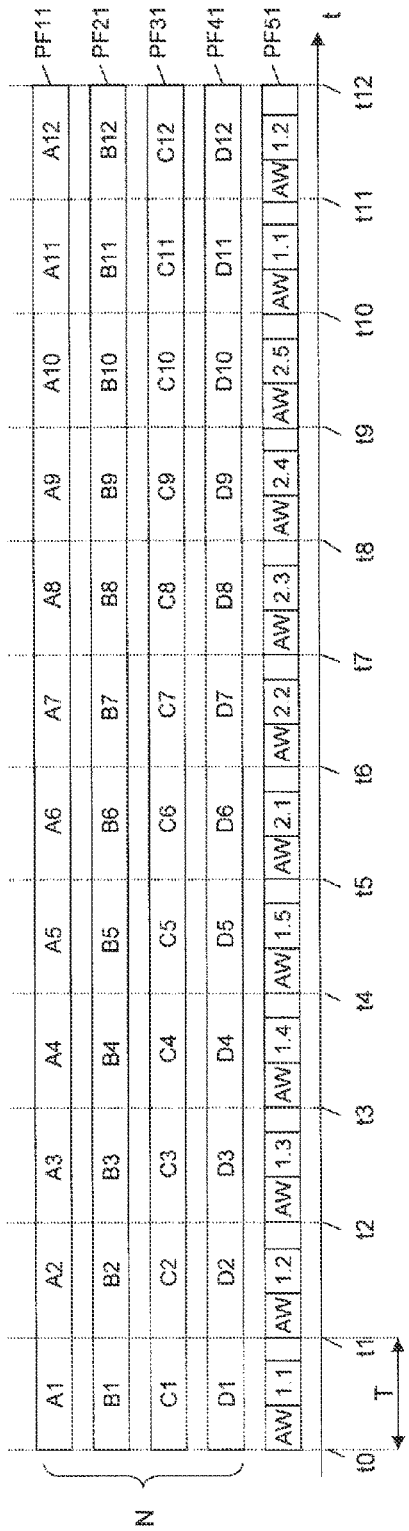
FIGS. 5a and 5b show the structure of five parallel data flows, before and after processing by the rotator, respectively, in case super-frames are employed.
Figure 5B:
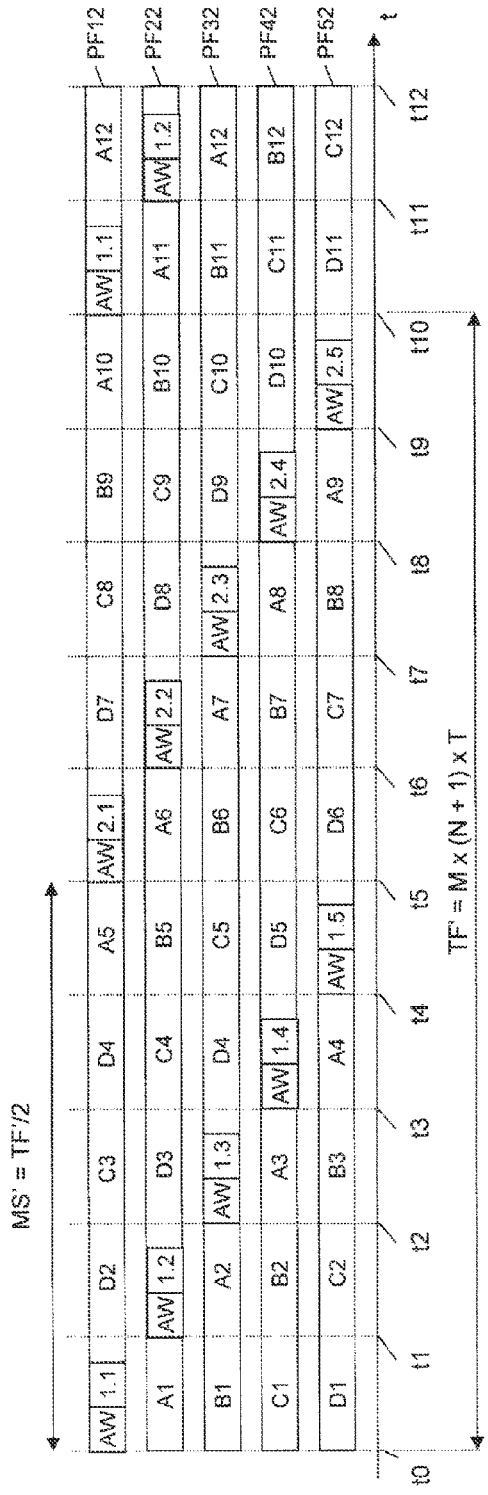

This drawback may be overcome by grouping M TF frames in a super-frame, as shown in FIG. 5a. Grouping may be performed e.g. by inserting in the fifth parallel data flow PF51, after each alignment word AW, a frame identifier. The frame identifier preferably has a PF-id index and a super-frame index, which may be for instance in the format: "super-frame index. PF-id"; the PF-id index is not strictly required for the multi-frame but is used in the description just to show how the various described features can be combined. For instance, in case N=4 and M=2, the indexes are 1.1 to 1.5 for the first super frame, and 2.1 to 2.5 for the second super frame. The super-frame period TF' is therefore equal to M×(N+1)×T. Accordingly, the maximum skew MS' that can be compensated in now equal to half the super-frame period TF', i.e. M×(N+1)×T/2. Such a maximum skew MS' is shown in FIG. 5b, and with N=4 and M=2 is therefore equal to 5×T. Therefore, without changing the period T, the maximum skew that can be compensated is increased from 2.5 T to 5 T.

Correspondingly, a same maximum skew can be compensated by using a period T that is half the period to be used according to the embodiment shown in FIGS. 2a and 2b. For instance, if the maximum skew that is allowed by the communication system SC is 500 bytes, with N=1 and M=2, the minimum period T allowed is T=100 bytes. As described above, if not super-frames are used, a maximum skew of 500 bytes requires a period T of at least 200 bytes.

This latter embodiment with super-frames therefore advantageously allows decoupling the choice of the period T from the requirements in terms of maximum skew recovery capability.

The invention claimed is:

1. A method for transmitting N parallel data flows on a parallel bus having at least N+1 physical connections from a first communication device to a second communication device, said method comprising, at said first communication device:
 a) generating an additional parallel data flow comprising a plurality of alignment words periodically distributed with a period T;
 b) at each period T, rotating said N parallel data flows and said additional parallel data flow between said at least N+1 physical connections thus generating N+1 rotated parallel data flows, each of said N+1 rotated parallel data flows being structured in frames having a frame period ((N+1)×T), each of said frames comprising an alignment word of said plurality of alignment words;
 c) transmitting said N+1 rotated parallel data flows on respective physical connections of said parallel bus, said method further comprising, at said second communication device:

d) aligning each of said N+1 rotated parallel data flows by using said plurality of alignment words, thus compensating skew and obtaining N+1 aligned parallel data flows; and e) at each period T, de-rotating said N+1 aligned parallel data flows, thus generating N de-rotated parallel data flows corresponding to said N parallel data flows.

2. The method according to claim 1, wherein said step b) comprises rotating said number N of parallel data flows and said further parallel data flow (PF51) at every time instant tk at which one of plurality of alignment words of said further parallel data flow (PF51) begin wherein k is an integer index.

3. The method according to claim 2, wherein said step b) comprises, at every time instant tk wherein k is an integer index, shifting transmission of each parallel data flow of said number N of parallel data flows and said further parallel data flow from an m-th physical connection of said parallel bus to an m'-th physical connection of said parallel bus, wherein:

said m-th physical connection is a physical connection that would transport said each parallel data flow if no rotation were performed, and m' is given by the following equation:

$$m'=[1+((m-1)+(k+\Phi)\mathrm{mod}(N+1))\mathrm{mod}(N+1)],$$

$\Phi$ being a fixed phase shift ranging from 0 to said number N.

4. The method according to claim 1, wherein said step d) comprises:

selecting a rotated parallel data flow among said further number N+1 of rotated parallel data flows;

generating an internal reference time base comprising internal reference time instants (t'0, t'1, ... t'7) delimiting segments transported by said selected rotated parallel data flow;

for each of said further number N+1 of rotated parallel data flows, generating an alignment information indicative of a time shift relative to said internal reference time base; and aligning each rotated parallel data flow to said selected rotated parallel data flow according to said alignment information.

5. The method according to claim 4, wherein said step d) further comprises:

according to said alignment information, selecting a most delayed rotated parallel data flow among said rotated parallel data flows; and generating an external reference time base comprising external reference time instants (t"0, t"1, ... t"7) delimiting segments transported by said most delayed rotated parallel data flow.

6. The method according to claim 5, wherein said step e) comprises de-rotating said further number N+1 of aligned parallel data flows at each of said external reference time instants (t"0, t"1, ... t"7).

7. The method according to claim 6, wherein said step e) comprises, at each of said external reference time instants (t"0, t"1, ... t"7), shifting transmission of each aligned parallel data flow of said further number N+1 of aligned parallel data flows from an m'-th physical connection of said parallel bus to an m"-th physical connection of said parallel bus, wherein:

said m'-th physical connection is a physical connection from which said each aligned parallel data flow is received, and m" is given by the following equation:

$$m''=[1+((m'-1)+(N+1)-(k+\Phi')\mathrm{mod}(N+1))\mathrm{mod}(N+1)]$$

$\Phi'$ being a further fixed phase shift ranging from 0 to said number N and k being an integer index.

8. The method according to claim 1, wherein it further comprises, between said steps b) and c), a step of scrambling contents of said further number N+1 of rotated parallel data flows except said alignment words.

9. The method according to claim 8, wherein it further comprises, between said steps d) and e), a step of de-scrambling contents of said aligned data flows except said alignment words.

10. The method according to claim 1, wherein said alignment words have a duration lower than said period T, so that said further parallel data flow comprises free bits between consecutive alignment words.

11. The method according claim 10, wherein said step a) further comprises a step of using said free bits for one or more of the following purposes: correction of errors, insertion of identifiers of said parallel flows, insertion of symbols for DC coupling, generation of transitions for facilitating clock recovery, increase of available bandwidth of said parallel bus.

12. The method according to claim 11, wherein said step a) comprises inserting in said free bits, after each of said plurality of alignment words, a frame identifier suitable for identifying, after said step b) is performed, each of said further number N+1 of rotated parallel data flows.

13. A communication system comprising a first communication device, a parallel bus and a second communication device, said first communication device being configured to transmit N of parallel data flows to said second communication device on said parallel bus having at least N+1 physical connections, wherein said first communication device comprises:

an alignment word generator configured to generate an additional parallel data flow comprising a plurality of alignment words periodically distributed with a period (T);

a rotator configured to, at each period T, rotate said N of parallel data flows and said additional parallel data flow between said at least N+1 physical connections thus generating N+1 rotated parallel data flows, each of said N+1 of rotated parallel data flows being structured in frames having a frame period ((N+1)×T), each of said frames comprising an alignment word of said plurality of alignment words;

and wherein said second communication device comprises:

N+1 of aligners configured to align each of said N+1 rotated parallel data flows by using said plurality of alignment words, thus compensating skew and obtaining said N+1 of aligned parallel data flows; and a de-rotator configured for, at each period T, de-rotating said N+1 of aligned parallel data flows thus generating N de-rotated parallel data flows corresponding to said N of parallel data flows.

* * * * *